(12) United States Patent
Yamaguchi et al.

(10) Patent No.: US 6,605,366 B2
(45) Date of Patent: Aug. 12, 2003

(54) METAL FILM/AROMATIC POLYMIDE FILM LAMINATE

(75) Inventors: Hiroaki Yamaguchi, Tokyo (JP); Fumio Aoki, Chiba (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/774,894

(22) Filed: Jan. 31, 2001

(65) Prior Publication Data

US 2001/0010860 A1 Aug. 2, 2001

(30) Foreign Application Priority Data

Jan. 31, 2000 (JP) .................................... 2000-021961

(51) Int. Cl.⁷ .............................................. B32B 27/28
(52) U.S. Cl. .................... 428/473.5; 428/213; 428/214; 428/215; 156/182; 156/306.6
(58) Field of Search ................. 428/473.5, 213, 428/214, 215; 156/182, 306.6

(56) References Cited

U.S. PATENT DOCUMENTS

| 5,089,593 | A | * | 2/1992 | Fjare et al. | ............... | 428/473.5 |
| 5,739,263 | A | * | 4/1998 | Yoshida et al. | ............. | 427/154 |
| 5,741,598 | A | * | 4/1998 | Shiotani et al. | ............. | 428/458 |
| 6,217,996 | B1 | * | 4/2001 | Yamamoto et al. | ......... | 428/220 |
| 6,251,507 | B1 | * | 6/2001 | Yamamoto et al. | ......... | 428/213 |

* cited by examiner

*Primary Examiner*—James J. Seidleck
*Assistant Examiner*—Melanie Bissett
(74) *Attorney, Agent, or Firm*—Reed Smith LLP

(57) ABSTRACT

A metal film, particularly, a stainless steel film having been not subjected to roughing treatment, and an aromatic polyimide substrate film having a thermoplastic surface can be combined with a high bonding strength to form a metal film/aromatic polyimide film laminate, utilizing an amorphous aromatic polyimide film of 0.05 to 3 $\mu$m thick which has a glass transition temperature in the range of 200 to 300° C.

9 Claims, 1 Drawing Sheet

METAL FILM/AROMATIC POLYIMIDE FILM LAMINATE

This application claims Paris Convention priority of Japanese Patent Application No. 2000-021961 filed Jan. 31, 2000, the complete disclosure of which is hereby incorporated by reference.

FIELD OF THE INVENTION

This invention relates to a metal film/aromatic polyimide film laminate and further relates to a metal film/aromatic polyimide film/metal film laminate.

BACKGROUND OF THE INVENTION

Aromatic polyimide films show good high temperature resistance, good chemical properties, high electrical insulating property, and high mechanical strength, and therefore are widely employed in various technical fields. For instance, an aromatic polyimide film is favorably employed in the form of a continuous aromatic polyimide film/metal film composite sheet for manufacturing a flexible printed circuit board (FPC), a carrier tape for tape-automated-bonding (TAB), and a tape of lead-on-chip (LOC) structure.

The aromatic polyimide film/metal film composite sheet can be produced by bonding a polyimide film to a metal film using a conventional adhesive such as an epoxy resin. However, due to low heat-resistance of the conventional adhesive, the produced composite sheet cannot show satisfactory high heat-resistance.

For obviating the above-mentioned problem, a variety of bonding methods have been proposed. For instance, an aromatic polyimide film/metal film composite sheet is manufactured by producing a copper metal film on an aromatic polyimide film by electroplating. Otherwise, an aromatic polyamide solution (i.e., a solution of a precursor of an aromatic polyimide resin) is coated on a copper film, dried, and heated for producing an aromatic polyimide film on the copper film.

An aromatic polyimide film/metal film composite sheet also can be produced using a thermoplastic polyimide resin.

U.S. Pat. No. 4,543,295 describes a polyimide laminate which is produced by applying a pressure onto a composite sheet composed of an aromatic polyimide film, a polyimide adhesive, and a metal film in vacuo.

In most of the known metal film/aromatic polyimide film laminates, the bonding between the metal film and the polyimide film is satisfactorily high. However, it has been found by the present inventors that a metal film having a smooth surface, such as a stainless steel film having been not subjected to surface roughening treatment, shows poor adhesion to the known thermoplastic polyimide film. The stainless steel film having smooth surface is employed, for instance, in the form of a stainless steel film/aromatic polyimide film/copper film laminate as a part of a slider/suspension assembly for data recording disc system.

SUMMARY OF THE INVENTION

It is an object of the invention to provide a metal film/aromatic polyimide film laminate in which a metal film is bonded to an aromatic polyimide film at a high bonding strength, even if the metal film has a smooth surface.

It is another object of the invention to provide a metal film/aromatic polyimide film/metal film laminate in which each metal film is bonded to an aromatic polyimide film at a high bonding strength, even if one of the metal films has a smooth surface.

The invention resides in a metal film/aromatic polyimide film laminate comprising a metal film and an aromatic polyimide substrate film, which are combined with each other by an intervening amorphous aromatic polyimide film of 0.05 to 3 μm thick which has a glass transition temperature in the range of 200 to 300° C.

The invention also resides in a metal film/aromatic polyimide film laminate comprising a metal film and an amorphous aromatic polyimide film fixed onto the metal film, the polyimide film having a thickness of 0.05 to 3 μm and a glass transition temperature of 200 to 300° C.

The invention also resides in a metal film/aromatic polyimide film/metal film laminate comprising a first metal film, an amorphous aromatic polyimide film of 0.05 to 3 μm thick which has a glass transition temperature in the range of 200 to 300° C., an aromatic polyimide substrate film, and a second metal film, in order, in which the substrate film has a thickness of 10 to 150 μm and a linear expansion coefficient of not higher than $30 \times 10^{-6}$ cm/cm/° C. in the temperature range of 50 to 200° C., and comprises a non-thermoplastic polyimide base film and a thermoplastic polyimide layer fixed onto each surface of the base film.

DETAILED DESCRIPTION OF THE INVENTION

Figure 1:
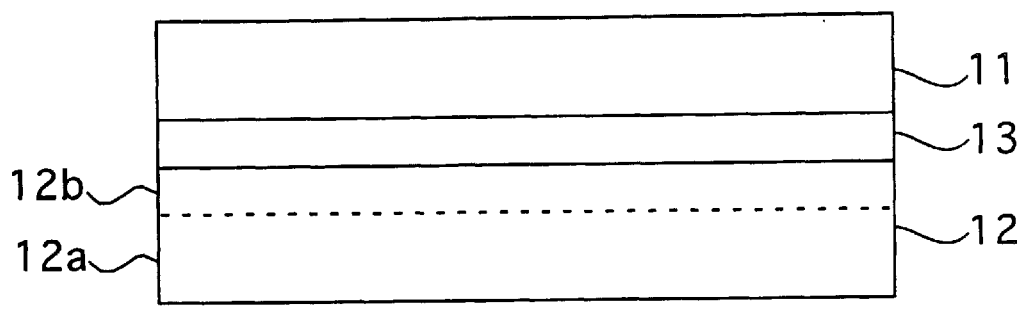
FIG. 1 illustrates a schematic view of section of a metal film/aromatic polyimide film laminate according to the invention.
Figure 2:
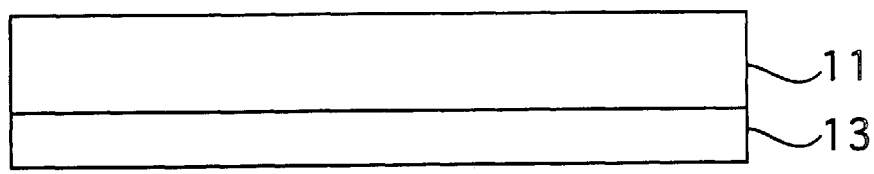
FIG. 2 illustrates a schematic view of section of a metal film/aromatic polyimide film laminate according to the invention.

The metal film/aromatic polyimide film laminate of the invention essentially has a united structure which has a section illustrated in the attached FIGS. 1 or 2.

In FIG. 1, the laminate comprises a metal film 11, an aromatic polyimide substrate film 12, and an intervening amorphous aromatic polyimide film 13. The substrate film 12 preferably has a non-thermoplastic aromatic polyimide base film 12a and a thermoplastic aromatic polyimide layer 12b, which is placed in contact with the amorphous polyimide film 13.

In FIG. 2, the laminate comprises a metal film 11 and an amorphous aromatic polyimide film 13.

Figure 3:
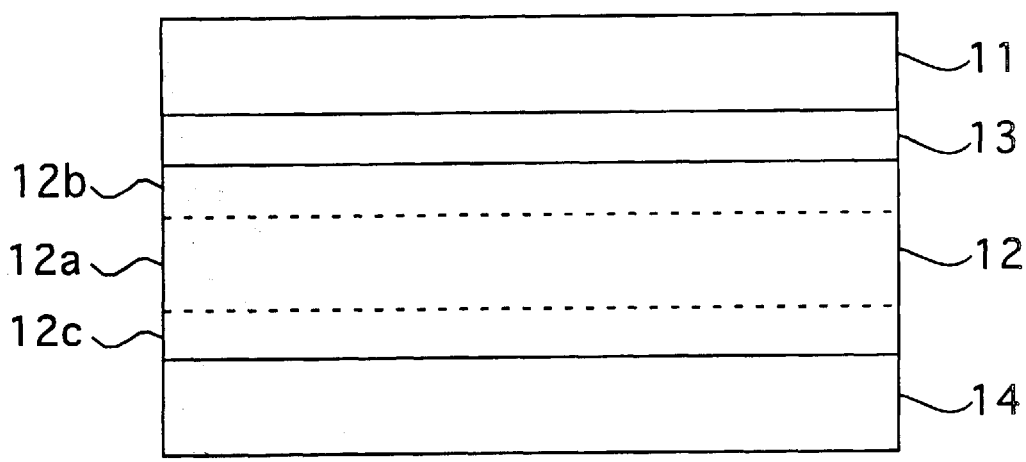
FIG. 3 illustrates a schematic view of section of a metal film/aromatic polyimide film/metal film laminate according to the invention.

The metal film/aromatic polyimide film/metal film laminate of the present invention essentially has a united structure which has a section illustrated in the attached FIG. 3.

In FIG. 3, the laminate comprises a first metal film 11, an aromatic polyimide substrate film 12, an intervening amorphous aromatic polyimide film 13, and a second metal film 14. The substrate film 12 preferably has a non-thermoplastic aromatic polyimide base film 12a and thermoplastic aromatic polyimide layers 12b, 12c, each of which is placed on each surface of the base film 12a. The thermoplastic polyimide layer 12b is fixed to the amorphous polyimide film 13, while the thermoplastic polyimide layer 12c is fixed to the metal film 14.

Examples of the metal films include copper films, stainless steel films, aluminum films, gold films, and metal alloy films. The metal film generally has a thickness of 1 to 500 μm.

According to the study of the present inventors, the amorphous aromatic polyimide film of the invention can be firmly fixed under pressure with heating to a metal film having a smooth surface such as a stainless steel film having been not subjected to surface roughening treatment. Accordingly, it is advantageous that the metal film to be placed in contact with the amorphous aromatic polyimide film is a metal film having a smooth surface such as that having been not subjected to surface roughening treatment. Examples of the metal films having a smooth surface include SUS (stainless steel) 304HTAMW (available from Shin-Nippon Steel Co., Ltd) and an aluminum film (A1085H-H18) (available from Nippon Metal Foil Manufacturing Co., Ltd.), both of which have been not subjected to surface roughening treatment.

The metal film having a surface roughness (Ra) of 0.2 $\mu$m or less is also advantageously employed.

Metal films having rough surface such as those having been subjected to surface roughening treatment can be naturally employed.

The amorphous aromatic polyimide film of the invention can be formed on the metal film by coating a solution of a polyimide precursor on the metal film to form a coated solution layer and subsequently heat the coated solution layer, whereby the solution layer is dried and the polyimide precursor is converted into the desired amorphous aromatic polyimide.

For the preparation of the amorphous aromatic polyimide film, a combination of one or more of the following tetracarboxylic dianhydrides and one or more of the following diamine compounds is favorably employed:

(1) 3,3',4,4'-biphenyltetracarboxylic dianhydride (s-BPDA), 2,3,3',4'-biphenyltetracarboxylic dianhydride (a-BPDA), 2,2-bis(3,4-dicarboxyphenyl)propane dianhydride, and bis(3,4-dicarboxyphenyl)ether dianhydride; and (2) 1,3-bis(4-aminophenoxy)benzene (TPE-R), 1,3-bis(3-aminophenoxy)benzene (APB), 2,2-bis(4-aminophenoxyphenyl)propane (BAPP), 4,4'-bis(4-aminophenoxyphenyl)sulfone (BAPS), bis[4-(3-aminophenoxy)phenyl]sulfone (BAPS-M), and bis(4-aminophenoxy)biphenyl.

The tetracarboxylic dianhydrides can be in the form of their free acids, acid esters, or half esters. A portion (less than 50 mol. %) of the tetracarboxylic dianhydride can be replaced with other tetracarboxylic acids such as pyromellitic dianhydride.

Other diamine compounds having a structure in which two or more aromatic rings are connected to each other by a bonding group such as —O—, —C(CH$_3$)$_2$—, or —SO$_2$— may be employed. A portion (less than 50 mol. %) of the diamine compound can be replaced with other diamines such as 4,4'-diaminodiphenyl ether.

The terminal of the resulting amorphous polyimide can be capped with phthalic dianhydride.

The tetracarboxylic dianhydride and the diamine compound are generally employed in stoichiometric amounts. However, the diamine compound can be employed in a slightly large or small amount (within ±6 molar %).

Preferred combinations are as follows:

(1) 3,3',4,4'-biphenyltetracarboxylic dianhydride and 2,2-bis(aminophenoxyphenyl)propane;

(2) 3,3',4,4'-biphenyltetracarboxylic dianhydride and 1,3-bis(3-aminophenoxy)benzene;

(3) 3,3',4,4'-biphenyltetracarboxylic dianhydride, and a combination of 2,2-bis(aminophenoxyphenyl)propane and 1,3-bis(3-aminophenoxy)benzene;

(4) 2,3,3',4'-biphenyltetracarboxylic dianhydride and 1,3-bis(4-aminophenoxy)benzene; and (5) 3,3',4,4'-biphenyltetracarboxylic dianhydride and 4,4'-bis(4-aminophenoxyphenyl)sulfone.

An amorphous polyimide produced from the combination of 3,3',4,4'-biphenyltetracarboxylic dianhydride and 2,2-bis(aminophenoxyphenyl)propane shows good dope stability, a high adhesion, a low water absorption, and good resistance to hydrolysis. Accordingly, the combination of 3,3',4,4'-biphenyltetracarboxylic dianhydride and 2,2-bis(aminophenoxyphenyl)propane is most preferred.

The amorphous polyimide film can be produced by the process set forth below.

The reactive compounds, i.e., a tetracarboxylic dianhydride and a diamine compound, are caused to react in an organic solvent at a temperature of approximately 100° C. or lower, preferably at a temperature of 20 to 60° C., so as to produce a polyamide acid, namely, a polyimide precursor. The polyamide acid solution or its diluted solution is employed as a dope for coating on a metal film to form a dope film on the metal film. The dope solution preferably contains the polyamide acid in an amount of 1 to 20 wt. %. The dope film is heated to a temperature of 50 to 400° C. for 1 to 30 min., so as to evaporate the solvent and further produce a corresponding polyimide film by way of cyclization reaction.

In summary, the metal film/amorphous aromatic polyimide film laminate of FIG. 2 is preferably produced by the steps of:

coating on one surface of a metal film a solution of a polyimide precursor which is produced from the combination of tetracarboxylic dianhydride(s) of (1) above and diamine compound(s) of (2) above, to form a coated solution film on the metal film; and heating the coated solution film to produce an amorphous polyimide film on the metal film.

Thus, a metal film/amorphous aromatic polyimide film laminate as illustrated in FIG. 2 is produced.

On the metal film/amorphous aromatic polyimide film laminate is placed and pressed under heating an aromatic polyimide substrate film, to give a metal film/aromatic polyimide film laminate illustrated in FIG. 1.

The aromatic polyimide substrate film preferably has a thermoplastic surface at least on the side to be brought into contact with the amorphous polyimide film.

The substrate film preferably has a thickness of 10 to 150 $\mu$m and a linear expansion coefficient (in the MD direction) of not higher than 30×10$^{-6}$ cm/cm/° C., particularly 15×10$^{-6}$ to 25×10$^{-6}$ cm/cm/° C., in the temperature range of 50 to 200° C. A modules of tensile elasticity (in the MD direction, according to ASTM-D882) preferably is not less than 300 kg/mm$^2$.

The aromatic polyimide substrate film may have a single layer structure which can be made of a thermoplastic aromatic polyimide resin. However, preferred is a multi-layered substrate film having a non-thermoplastic aromatic polyimide base film and one or two thin thermoplastic aromatic polyimide layers placed on one side or both sides, respectively.

The thermoplastic aromatic polyimide is preferably produced from the following combination of an aromatic tetracarboxylic dianhydride and an aromatic diamine compound:

(1) 2,3,3',4'-biphenyltetracarboxylic dianhydride and 1,3-bis(4-aminophenoxybenzene);

(2) a combination of 2,3,3',4'-biphenyltetracarboxylic dianhydride and 4,4'-oxydiphthalic dianhydride and 1,3-bis(4-aminophenoxy)-2,2-dimethylpropane; or (3) a combination of pyromellitic dianhydride and 4,4'-oxydiphthalic dianhydride and 1,3-bis(4-aminophenoxybenzene).

The thermoplastic polyimide layer (or film) can be prepared from a dope solution containing an aromatic polyamide acid in an organic solvent, which is produced from one of the combinations of the aromatic tetracarboxylic dianhydride(s) and diamine compound(s) by a reaction in an organic solvent at a temperature of 100° C. or lower, particularly at a temperature of 20 to 60° C.

Alternatively, the thermoplastic polyimide layer can be formed using a solution of thermoplastic polyimide which is produced by heating the polyamide acid at a temperature of 150 to 250° C., or heating the polyamide acid at a temperature of lower than 150° C., particularly 15 to 50° C., in the presence of a imidizing agent, to give the desired polyimide in the solution; removing the solvent by evaporation or precipitating the polyimide in a bad solvent, to give a polyimide powder; and then dissolving the polyimide powder in an appropriate solvent.

In the preparation of the polyamide acid for the thermoplastic polyimide layer, relatively small amounts of other aromatic tetracarboxylic dianhydrides and/or diamine compounds may be employed in combination, in addition to these aromatic tetracarboxylic dianhydrides and diamine compounds, provided that no essential change of characteristics is brought about in the obtainable thermoplastic polyimide. Examples of the optionally employable aromatic tetracarboxylic dianhydrides include 3,3',4,4',-biphenyltetracarboxylic dianhydride, 2,2-bis(3,4-dicarboxyphenyl)propane dianhydride, and 2,3,6,7-naphthalenetetracarboxylic dianhydride.

Examples of the optionally employable diamine compounds include aromatic diamines which have a flexible molecular structure and contain plural benzene rings, such as 4,4'-diaminodiphenyl ether, 4,4'-diaminobenzophenone, 4,4'-diaminodiphenylmethane, 2,2-bis(4-aminophenyl) propane, 1,4-bis(4-aminophenoxy)benzene, 4,4'-bis(4-aminophenyl)diphenyl ether, 4,4'-bis(4-aminophenyl) diphenylmethane, 4,4'-bis(4-aminophenoxy)diphenyl ether, 4,4'-bis(4-aminophenoxy)diphenylmethane, 2,2-bis[4-(aminophenoxy)phenyl]propane, and 2,2-bis[4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable aromatic diamine compound can be employed in an amount of 20 molar % or less, particularly 10 mol. % or less, per the total amount of the diamine compounds. The optionally employable aliphatic diamine or diaminosiloxane can be employed in an amount of 20 molar % or less, per the total amount of the diamine compounds. If the optionally employable diamine compound is incorporated in an amount exceeding the above-mentioned upper limit, the heat-resistance of the resulting polyimide may become unsatisfactorily low.

In the preparation of the thermoplastic aromatic polyimide, a dicarboxylic anhydride such as phthalic anhydride or its derivative, hexahydrophthalic anhydride or its derivative, or succinic anhydride or its derivative can be incorporated so as to cap the amine terminal of the resulting aromatic polyimide.

In the preparation of the polyamide acid for the production of the thermoplastic polyimide layer, the diamine compound and the carboxylic anhydride compound (which includes a tetracarboxylic dianhydride and a dicarboxylic anhydride) are used in a molar ratio of 0.92:1 to 1.1:1, particularly 0.98:1 to 1.1:1, more particularly 0.99:1 to 1.1:1 in terms of the molar amount of the amino group and the molar amount of the carboxylic anhydride (i.e., the molar amount of the tetracarboxylic dianhydride, and the molar amount of the dicarboxylic anhydride, if it is used in combination). The dicarboxylic anhydride is preferably employed in a molar amount of 0.05 or less, based of one molar amount of the tetracarboxylic dianhydride. If the diamine compound and the carboxylic anhydride are used in a molar ratio outside of the above-mentioned range, the resulting thermoplastic aromatic polyimide may become to have a relatively small molecular weight so that the thermoplastic aromatic polyimide layer shows a low bonding strength to a metal film.

Further, a gelation-inhibiting agent such as a phosphorus-containing stabilizer (e.g., triphenyl phosphite, or triphenyl phosphate) may be employed in the process of polymerization of the polyamide acid in an amount of 0.01 to 1%, based on the amount of the polyamide acid. Also, an imidizing agent such as a basic organic catalyst (e.g., imidazole, 2-imidazole, 1,2-dimethylimidazole, or 2-phenylimidazole) may be added to the dope solution (i.e., polyamide acid solution) in an amount of 0.05 to 10 wt. %, particularly 0.1 to 2 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may be incorporated into the dope solution in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid can be performed in an organic solvent such as N-methyl-2-pyrollidone, N,N-dimethylformamide, N,N-dimethylacetamide, N,N-diethylacetamide, dimethylsulfoxide, hexamethylphosphoramide, N-methylcaprolactam, or cresol or its derivative. The organic solvents can be employed singly or in combination.

The non-thermoplastic polyimide base film preferably has no detectable glass transition temperature or has a glass transition temperature of higher than 350° C.

The non-thermoplastic polyimide base film preferably has a linear expansion coefficient (in the MD direction) of $5 \times 10^{-6}$ to $30 \times 10^{-6}$ cm/cm/° C., in the temperature range of 50 to 200° C. A modules of tensile elasticity (in the machine direction, MD, according to ASTM-D882) preferably is not less than 300 kg/mm$^2$.

The non-thermoplastic polyimide base film is composed of polyimide which is preferably produced from the following combination of a tetracarboxylic dianhydride and a diamine compound:

(1) 3,3',4,4'-biphenyltetracarboxylic dianhydride (s-BPDA) and p-phenylenediamine (PPD);

(2) 3,3',4,4'-biphenyltetracarboxylic dianhydride and a combination of p-phenylenediamine (PPD) and 4,4'-diaminodiphenyl ether (DADE), in which a molar ratio in terms of PPD/DADE preferably is more than 85/15;

(3) a combination of 3,3',4,4'-biphenyltetracarboxylic dianhydride and pyromellitic dianhydride and a combination of p-phenylenediamine and 4,4'-diaminodiphenyl ether;

(4) pyromellitic dianhydride and a combination of p-phenylenediamine (PPD) and 4,4'-diaminodiphenyl ether (DADE), in which a molar ratio in terms of PPD/DADE preferably is within 90/10 and 10/90; or (5) a combination of 3,3',4,4'-benzophenonetetracarboxylic dianhydride (BTDA) and pyromellitic dianhydride (PMDA) and a combination of p-phenylenediamine (PPD) and 4,4'-diaminodiphenyl ether (DADE), in which a molar ratio in terms of BTDA/PMDA preferably is within 20/80 and 90/10, and a molar ratio in terms of PPD/DADE preferably is within 30/70 and 90/10.

The possible employment of other tetracarboxylic dianhydride and diamine compounds, addition of various additives, the conditions of the preparation of polyimide described hereinbefore can be applied to the preparation of the non-thermoplastic polyimide base film.

The multi-layered aromatic polyimide substrate film can be advantageously produced by the known co-extrusion/cast method, in which one or two solutions of a precursor of thermoplastic polyimide and a solution of non-thermoplastic polyimide are simultaneously extruded from a dye having plural slits and overlaid one on another on a temporary support such as a continuous belt. The overlaid solution films are dried and then heated to produce the desired multi-layered film having the thermoplastic polyimide layer/non-thermoplastic polyimide layer structure, or the thermoplastic polyimide layer/non-thermoplastic polyimide layer/thermoplastic polyimide layer.

Alternatively, the multi-layered polyimide substrate film can be produced by placing a semi-dried solution film of a precursor of thermoplastic polyimide on a semidried solution film of a precursor of non-thermoplastic polyimide and heating the semi-dried films to give a multi-layered polyimide film.

Examples of the temporary supports include a stainless mirror surface and a stainless belt. The cast solutions are then heated on the temporary support to a temperature of 100 to 200° C., so as to give a self-supporting semi-cured film or a self-supporting film containing a small amount of a solvent. An extremely high temperature heating treatment may lower the desired bonding strength between the substrate film and the thermoplastic layer.

The three-layered solution film of polyamide acid and/or polyimide produced by the simultaneous casting is dried by heating and then further heated to a temperature between the glass transition temperature (Tg) and the decomposition temperature of the polyimide for the thermoplastic polyimide layer, preferably at a temperature of 250 to 420° C. (surface temperature measured by means of a surface thermometer), preferably for a period of 1 to 60 minutes. Thus produced three-layered aromatic polyimide film is composed of a structure of thermoplastic polyimide layer/polyimide base film/thermoplastic polyimide layer.

The simultaneous casting is favorably employed because it gives the substrate film with less thermal deterioration.

The thermoplastic polyimide preferably has a glass transition temperature (Tg) of 190 to 280° C., particularly 200 to 275° C. The thermoplastic polyimide preferably does not melt at temperatures between its Tg and 300° C., and preferably shows a modulus of elasticity of 0.001 to 0.5 time at 275° C., based on a modulus of elasticity measured at 50° C.

The polyimide film preferably has a thickness of 5 to 125 µm, while the thermoplastic polyimide layer preferably has a thickness of 1 to 25 µm (preferably 1 to 15 µm, more preferably 2 to 12 µm). In the polyimide substrate film, the base film preferably has a thickness of 7.5 to 98.5%, particularly 15 to 90%, based on the total thickness of the substrate film.

On the polyimide substrate film can be placed another metal film, if a metal film/polyimide film/metal film laminate is desired.

In summary, the metal film/aromatic polyimide film laminate is preferably produced by the steps of:
coating on one surface of a metal film a solution of a polyimide precursor which is produced from the combination of tetracarboxylic dianhydride(s) of (1) above and diamine compound(s) of (2) above, to form a coated solution film on the metal film;
heating the coated solution film to produce an amorphous polyimide film on the metal film; and
pressing under heating an aromatic polyimide substrate film having a thermoplastic surface onto the amorphous polyimide film on the metal film, under the condition that the thermoplastic surface is brought into contact with the amorphous polyimide film.

The invention further provides a metal film/polyimide (substrate) film/metal film laminate.

Examples of the metal films for attachment to the polyimide substrate film include copper film, aluminum film, iron film, gold film, or a film of metal alloy.

Preferred are an electrolytic copper film and a rolled copper film. The metal film preferably has a surface roughness (Rz) of 10 µm or less, more preferably 0.5 to 7 µm. A metal film having such surface roughness is available under the name of VLP or LP (or HTE) for a copper film. There is no limitation with respect to the thickness of the metal film, but a thickness in the range of 5 to 60 µm, particularly 5 to 20 µm, is preferred.

The metal film/aromatic polyimide film/metal film laminate of the invention is preferably produced by the steps of:
coating on one surface of a first metal film a solution of a polyimide precursor which is produced from the combination of tetracarboxylic dianhydride(s) of (1) above and diamine compound(s) of (2) above, to form a coated solution film on the metal film;
heating the coated solution film to produce an amorphous polyimide film on the metal film;
placing a second metal film and an aromatic polyimide substrate film having a thermoplastic surface on each surface thereof onto the amorphous polyimide film on the metal film, so as to form a film structure of the second metal film, the aromatic polyimide substrate film, the amorphous film, and the first metal film, in order; and
pressing the film structure under heating to fix each film onto an adjoining film thereof.

The double belt press is preferably employed for the procedure of pressing under heating. A representative double belt press is described in U.S. Pat. No. 4,599,128, and is commercially available from Held Corporation (Germany).

The invention is further described by the following examples.

In the following examples, the physical and chemical characteristics were determined by the methods described below:
Glass transition temperature (Tg): determined by means of DSC;
Crystallinity: determined by XRD (X-ray diffraction). When no peak is observed, the target is understood to be amorphous;
Tensile modules: ASTM-D882 (in the machine direction: MD)
Linear expansion coefficient (cm/cm/° C.): during 20 and 200° C., measured at 50/min. (MD);

Peeling strength: 90° peeling;

Heat resistance: swelling, peeling, and coloring are observed, after laminate is dipped for one minute in a solder bath heated to 260° C.

[Preparation of Thermoplastic Three-Layered Polyimide Substrate Film]

(1) Preparation of Dope for Thermoplastic Polyimide

In a reaction vessel equipped with a stirrer and a nitrogen gas inlet were successively placed N,N-dimethylacetamide (DMAc), a mixture of 1,3-bis(4-aminophenoxy)benzene (TPE-R) and 2,3,3',4'-biphenyltetracarboxylic dianhydride (a-BPDA) [1000:1000, molar ratio, in an amount to give a DMAc solution containing the mixture at 22 wt. %], and triphenylphosphate (0.1 wt. % per the amount of the above-mentioned mixture). The resulting mixture was kept at 25° C. for one hour under stirring, to give a dope having a solution viscosity of approx. 2,000 poise (at 25° C.).

(2) Preparation of Dope for Non-Thermoplastic Polyimide

In a reaction vessel equipped with a stirrer and a nitrogen gas inlet were successively placed N,N-dimethylacetamide (DMAc) and a mixture of p-phenylenediamine (PPD) and 3,3',4,4'-biphenyltetracarboxylic dianhydride (s-BPDA) [1000:988, molar ratio, in an amount to give a DMARc solution containing the mixture at 18 wt. %]. The resulting mixture was kept at 50° C. for 3 hrs. under stirring, to give a viscous brown dope having a solution viscosity of approx. 1,500 poise (at 25° C.).

(3) Production of Three-Layered Polyimide Substrate Film

The dope for thermoplastic polyimide and the dope for non-thermoplastic polyimide were simultaneously extruded onto a continuous metal belt from a manifold die having three slits under the condition that both dopes were extruded to give a three-layered structure of dope for thermoplastic polyimide/dope for non-thermoplastic polyimide/dope for thermoplastic polyimide. The resulting dope solution films were continuously dried by air (heated to 140° C.), until the solution films were solidified and united. The united films were separated from the metal belt and heated in a heating furnace at gradually increased temperatures of 200° C. to 320° C. In the course of heating, the solvent was evaporated and imidization was performed. Thus produced continuous three-layered polyimide film was wound around a roll.

The three-layered polyimide film had a total thickness of 25 $\mu$m (4 $\mu$m/17 $\mu$m/4 $\mu$m), a mean linear expansion coefficient of $21 \times 10^{-6}$ cm/cm/° C. (MD: $23 \times 10^{-6}$ cm/cm/° C., TD: $19 \times 10^{-6}$ cm/cm/° C., at 50–200° C.), and a tensile modules of 526 kg/mm$^2$. The non-thermoplastic polyimide of the center layer had no glass transition temperature at temperatures of lower than 400° C., while the thermoplastic polyimide on both sides had a glass transition temperature of 250° C. The thermoplastic polyimide had no gelling area and had a modules of elasticity at 270° C. as much as 0.002 time that at 50° C.

EXAMPLE 1

Production of Metal Film/Polyimide Film/Metal Film Laminate

In a reaction vessel, 32.84 g (0.08 mol.) of 2,2-bis(4-aminophenoxyphenyl)propane (BAPP) and 224.8 g of N,N-dimethylacetamide were stirred at room temperature under nitrogen gas atmosphere, until a solution was formed. To the resulting solution was added 23.31 g (0.079 mol.) of 3,3',4,4'-biphenyltetracarboxylic dianhydride (s-BPDA) was portionwise added, and the resulting mixture was stirred at 40° C. for 3 hours. Subsequently, 2.12 g (0.0058 mol.) of 3,3',4,4'-biphenyltetracarboxylic acid dihydrate (s-BPTA) was added and dissolved. Ten grams of the resulting polyamide acid solution was taken out and diluted with 30 g of dimethylacetamide (DMAc) to give a dope of 5% concentration. A molar ratio in terms of aromatic tetracarboxylic acid component/aromatic diamine component was 1.06.

The dope was coated on a stainless steel film of 20 $\mu$m thick (SUS 304HTAMW, Ra: 0.05 $\mu$m, available from Shin-Nippon Steel Co., Ltd) and heated at 120° C.×2 min., 150° C.×2 min., 180° C.×2 min., and 250° C.×2 min., to give a polyimide film having a thickness of 0.5 $\mu$m. The resulting polyimide film was made of amorphous polyimide having a glass transition temperature (Tg) of 245° C.

On the amorphous polyimide film formed on the stainless steel film were placed, in order, the three-layered polyimide film produced above, and a rolled copper film (BHY film, available from Japan Energy Co., Ltd., thickness: 18 $\mu$m, Ra: 0.18 $\mu$m). The resulting composite films were pressed at a temperature of 320° C. and a pressure of 50 kgf/cm$^2$ for one min., to give a stainless steel film/polyimide film/copper film laminate.

The laminate showed a 90° peel strength of 1.90 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 2

Production of Metal Film/Polyimide Film/Metal Film Laminate

The procedures of Example 1 were repeated except for employing an amorphous polyimide film of 0.20 $\mu$m thick, to give a stainless steel film/polyimide film/copper film laminate.

The laminate showed a 90° peel strength of 1.90 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 3

Production of Metal Film/Polyimide Film/Metal Film Laminate

The procedures of Example 1 were repeated except for changing the amount of s-BPTA to give a stainless steel film/polyimide film/copper film laminate. In the dope employed for the preparation of amorphous polyimide, a molar ratio in terms of aromatic tetracarboxylic acid component/aromatic diamine component was 1.040.

The laminate showed a 90° peel strength of 1.50 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 4

Production of Metal Film/Polyimide Film/Metal Film Laminate

The procedures of Example 1 were repeated except for using no s-BPTA, to give a stainless steel film/polyimide film/copper film laminate. A molar ratio in terms of aromatic tetracarboxylic acid component/aromatic diamine component in the dope for the preparation of amorphous polyimide was 0.958.

The laminate showed a 90° peel strength of 1.25 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 5
Production of Metal Film/Polyimide Film/Metal Film Laminate

The procedures of Example 1 were repeated except that an amorphous polyimide film of 0.5 μm was produced on the stainless steel film by heating a coated dope at 120° C.×2 min., 150° C.×2 min., 180° C.×2 min., and 350° C.×2 min., to give a stainless steel film/polyimide film/copper film laminate.

The laminate showed a 90° peel strength of 1.90 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 6
Production of Metal Film/Polyimide Film/Metal Film Laminate

In a reaction vessel, 17.54 g (0.0600 mol.) of 1,3-bis(4-aminophenoxy)benzene (TPE-R) and 124.80 g of N,N-dimethylacetamide were stirred at room temperature under nitrogen gas atmosphere, until a solution was formed. To the resulting solution was added 17.83 g (0.0606 mol.) of 2,3,3',4'-biphenyltetracarboxylic dianhydride (a-BPDA) was portionwise added, and the resulting mixture was stirred at 40° C. for 3 hours. The resulting polyamide acid solution was diluted with dimethylacetamide (DMAc) to give a dope of 5% concentration. A molar ratio in terms of aromatic tetracarboxylic acid component/aromatic diamine component in the dope was 1.01.

The procedures of Example 1 were repeated except that the dope obtained above was employed, to give a stainless steel film/polyimide film/copper film laminate.

The amorphous polyimide film formed on the stainless steel film had a glass transition temperature (Tg) of 252° C.

The laminate showed a 90° peel strength of 0.90 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 7
Production of Metal Film/Polyimide Film/Metal Film Laminate

In a reaction vessel, 7.39 g (0.018 mol.) of 2,2-bis(4-aminophenoxyphenyl)propane (BAPP), 0.58 g (0.002 mol.) of 1,3-bis(3-aminophenoxy)benzene (APB), and 55.40 g of N,N-dimethylacetamide were stirred at room temperature under nitrogen gas atmosphere, until a solution was formed. To the resulting solution was added 5.83 g (0.0198 mol.) of 3,3',4,4'-biphenyltetracarboxylic dianhydride (s-BPDA) was portionwise added, and the resulting mixture was stirred at 40° C. for 3 hours. The resulting polyamide acid solution was diluted with dimethylacetamide (DMAc) to give a dope of 5% concentration. A molar ratio in terms of aromatic tetracarboxylic acid component/aromatic diamine component in the dope was 0.99.

The procedures of Example 1 were repeated except that the dope obtained above was employed, to give a stainless steel film/polyimide film/copper film laminate.

The amorphous polyimide film formed on the stainless steel film had a glass transition temperature (Tg) of 241° C.

The laminate showed a 90° peel strength of 1.55 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 8
Production of Metal Film/Polyimide Film/Metal Film Laminate

In a reaction vessel, 3.28 g (0.008 mol.) of 2,2-bis(4-aminophenoxyphenyl)propane (BAPP), 0.58 g (0.002 mol.) of 1,3-bis(3-aminophenoxy)benzene (APB), and 27.20 g of N,N-dimethylacetamide were stirred at room temperature under nitrogen gas atmosphere, until a solution was formed. To the resulting solution was added 3.00 g (0.0102 mol.) of 3,3',4,4'-biphenyltetracarboxylic dianhydride (s-BPDA) was portionwise added, and the resulting mixture was stirred at 40° C. for 3 hours. The resulting polyamide acid solution was diluted with dimethylacetamide (DMAc) to give a dope of 5% concentration. A molar ratio in terms of aromatic tetracarboxylic acid component/aromatic diamine component in the dope was 1.02.

The procedures of Example 1 were repeated except that the dope obtained above was employed, to give a stainless steel film/polyimide film/copper film laminate.

The amorphous polyimide film formed on the stainless steel film had a glass transition temperature (Tg) of 239° C.

The laminate showed a 90° peel strength of 2.30 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 9
Production of Metal Film/Polyimide Film/Metal Film Laminate

In a reaction vessel, 4.32 g (0.01 mol.) of bis[4-(3-aminophenoxy)phenyl]sulfone (BAPS-M), and 29.04 g of N,N-dimethylacetamide were stirred at room temperature under nitrogen gas atmosphere, until a solution was formed. To the resulting solution was added 3.00 g (0.0102 mol.) of 3,3',4,4'-biphenyltetracarboxylic dianhydride (s-BPDA) was portionwise added, and the resulting mixture was stirred at 40° C. for 3 hours. The resulting polyamide acid solution was diluted with dimethylacetamide (DMAc) to give a dope of 5% concentration. A molar ratio in terms of aromatic tetracarboxylic acid component/aromatic diamine component in the dope was 1.02.

The procedures of Example 1 were repeated except that the dope obtained above was employed, to give a stainless steel film/polyimide film/copper film laminate.

The amorphous polyimide film formed on the stainless steel film had a glass transition temperature (Tg) of 245° C.

The laminate showed a 90° peel strength of 1.50 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 10
Production of Metal Film/Polyimide Film/Metal Film Laminate

In a reaction vessel, 1.46 g (0.006 mol.) of 1,3-bis(3-aminophenoxy)benzene (APB), and 22.72 g of N,N-dimethylacetamide were stirred at room temperature under nitrogen gas atmosphere, until a solution was formed. To the resulting solution was added 1.50 g (0.0051 mol.) of 3,3',4,4'-biphenyltetracarboxylic dianhydride (s-BPDA) was portionwise added, and the resulting mixture was stirred at 40° C. for 3 hours. The resulting polyamide acid solution was diluted with dimethylacetamide (DMAc) to give a dope of 5% concentration. A molar ratio in terms of aromatic tetracarboxylic acid component/aromatic diamine component in the dope was 1.02.

The procedures of Example 1 were repeated except that the dope obtained above was employed, to give a stainless steel film/polyimide film/copper film laminate.

The amorphous polyimide film formed on the stainless steel film had a glass transition temperature (Tg) of 206° C.

The laminate showed a 90° peel strength of 2.05 kgf/cm on the interface between the stainless steel film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

EXAMPLE 11
Production of Metal Film/Polyimide Film/Metal Film Laminate

The procedures of Example 1 were repeated except for replacing the stainless steel film with a rolled aluminum film (A1085H-H18, thickness: 40 μm, available from Nippon Metal Foil Manufacturing Co., Ltd.), to give an aluminum film/polyimide film/copper film laminate.

The laminate showed a 90° peel strength of 1.25 kgf/cm on the interface between the aluminum film and the polyimide film and a 90° peel strength of 1.5 kgf/cm on the interface between the copper film and the polyimide film.

The laminate was dipped for one minute in a solder bath heated to 260° C. Any of swelling, peeling, and coloring were not observed.

COMPARISON EXAMPLE 1
Production of Metal Film/Polyimide Film/Metal Film Laminate In a reaction vessel, 2.00 g (0.01 mol.) of 4,4-diaminodiphenyl ether and 19.76 g of N,N-dimethylacetamide were stirred at room temperature under nitrogen gas atmosphere, until a solution was formed. To the resulting solution was added 3.00 g (0.0102 mol.) of 2,3,3',4'-biphenyltetracarboxylic dianhydride (a-BPDA) was portionwise added, and the resulting mixture was stirred at 40° C. for 3 hours. The resulting polyamide acid solution was diluted with dimethylacetamide (DMAc) to give a dope of 5% concentration. A molar ratio in terms of aromatic tetracarboxylic acid component/aromatic diamine component in the dope was 1.02.

The procedures of Example 1 were repeated except that the dope obtained above was employed, to give a stainless steel film/polyimide film/copper film laminate.

The amorphous polyimide film formed on the stainless steel film had a glass transition temperature (Tg) of 325° C.

The laminate showed a 90° peel strength of 0.20 kgf/cm on the interface between the stainless steel film and the polyimide film and a 90° peel strength of 1.5 kgf/cm on the interface between the copper film and the polyimide film.

COMPARISON EXAMPLE 2
Production of Metal Film/Polyimide Film/Metal Film Laminate In a reaction vessel, 17.54 g (0.0600 mol.) of 1,3-bis(4-aminophenoxy)benzene (TPE-R) and 124.80 g of N,N-dimethylacetamide were stirred at room temperature under nitrogen gas atmosphere, until a solution was formed. To the resulting solution was added 18.01 g (0.0612 mol.) of 3,3',4,4'-biphenyltetracarboxylic dianhydride (s-BPDA) was portionwise added, and the resulting mixture was stirred at 40° C. for 3 hours. The resulting polyamide acid solution was diluted with dimethylacetamide (DMec) to give a dope of 5% concentration. A molar ratio in terms of aromatic tetracarboxylic acid component/aromatic diamine component in the dope was 1.02.

The procedures of Example 1 were repeated except that the dope obtained above was employed, to give a stainless steel film/polyimide film/copper film laminate.

The polyimide layer formed on the stainless steel film was crystalline, which had a glass transition temperature (Tg) of 234° C.

The laminate showed a 90° peel strength of 0.10 kgf/cm on the interface between the stainless steel film and the polyimide film and a 90° peel strength of 1.5 kgf/cm on the interface between the copper film and the polyimide film.

COMPARISON EXAMPLE 3
Production of Metal Film/Polyimide Film/Metal Film Laminate The procedures of Example 1 were repeated except for forming no polyimide film, to give a stainless steel film/polyimide film/copper film laminate.

The laminate showed a 90° peel strength of 0.50 kgf/cm on the interface between the aluminum film and the polyimide film and a 90° peel strength of 1.5 kgf/cm on the interface between the copper film and the polyimide film.

What is claimed is:

1. A metal film/aromatic polyimide films/metal film laminate comprising a first metal film, an amorphous aromatic polyimide film of 0.05 to 3 μm thick which has a glass transition temperature in the range of 200 to 300° C., an aromatic polyimide substrate film, and a second metal film in order, the second metal film being a copper film having been subjected to surface roughing treatment, the substrate film having a thickness of 10 to 150 μm and a linear expansion coefficient of not higher than 30×10$^{-6}$ cm/cm/° C. in the temperature range of 50 to 200° C., and comprising a non-thermoplastic polyimide base layer and a pair of thermoplastic polyimide layers each of which is fixed onto each surface of the base layer.

2. The laminate of claim 1, wherein the first metal film is a stainless steel film having been not subjected to surface roughening treatment.

3. The laminate of claim 1, wherein the non-thermoplastic polyimide base film has no detectable glass transition temperature or has a glass transition temperature of higher than 350° C.

4. The laminate of claim 3, wherein the non-thermoplastic polyimide base film comprises polyimide which is produced from the following combination of a tetracarboxylic dianhydride and a diamine compound:

(1) 3,3',4,4'-biphenyltetracarboxylic dianhydride and p-phenylenediamine;
   (2) 3,3',4,4'-biphenyltetracarboxylic dianhydride and a combination of p-phenylenediamine and 4,4'-diaminodiphenyl ether;
   (3) a combination of 3,3',4,4'-biphenyltetracarboxylic dianhydride and pyromellitic dianhydride and a combination of p-phenylenediamine and 4,4'-diaminodiphenyl ether;

(4) pyromellitic dianhydride and a combination of p-phenylenediamine and 4,4'-diaminodiphenyl ether; or (5) a combination of 3,3',4,4'-benzophenonetetracarboxylic dianhydride and pyromellitic dianhydride and a combination of p-phenylenediamine and 4,4'-diaminodiphenyl ether.

5. The laminate of claim 3, wherein the thermoplastic polyimide layer comprises polyimide which is produced from the following combination of a tetracarboxylic acid dianhydride and a diamine compound:

(1) 2,3,3',4'-biphenyltetracarboxylic dianhydride and 1,3-bis(4-aminophenoxybenzene);

(2) a combination of 2,3,3',4'-biphenyltetracarboxylic dianhydride and 4,4'-oxydiphthalic dianhydride and 1,3-bis(4-aminophenoxy)-2,2-dimethylpropane; or (3) a combination of pyromellitic dianhydride and 4,4'-oxydiphthalic dianhydride and 1,3-bis(4-aminophenoxybenzene).

6. The laminate of claim 1, wherein the amorphous aromatic polyimide film comprises polyimide which is produced from a combination of one or more of the following tetracarboxylic dianhydrides and one or more of the following diamine compounds:

(1) 3,3',4,4'-biphenyltetracarboxylic dianhydride, 2,3,3',4'-biphenyltetracarboxylic dianhydride, 2,2-bis(3,4-dicarboxyphenyl)propane dianhydride, and bis(3,4-dicarboxyphenyl)ether dianhydride; and (2) 1,3-bis(4-aminophenoxy)benzene, 1,3-bis(3-aminophenoxy)benzene, 2,2-bis(4-aminophenoxyphenyl)propane, 4,4'-bis(4-aminophenoxyphenyl)sulfone, and bis(4-aminophenoxy) biphenyl.

7. The laminate of claim 1, wherein the amorphous aromatic polyimide film comprises polyimide which is produced from the following combination of a tetracarboxylic dianhydride and a diamine compound:

(1) 3,3',4,4'-biphenyltetracarboxylic dianhydride and 2,2-bis(aminophenoxyphenyl)propane;

(2) 3,3',4,4'-biphenyltetracarboxylic dianhydride and 1,3-bis(3-aminophenoxy)benzene;

(3) 3,3',4,4'-biphenyltetracarboxylic dianhydride, and a combination of 2,2-bis(aminophenoxyphenyl)propane and 1,3-bis(3-aminophenoxy)benzene;

(4) 2,3,3',4'-biphenyltetracarboxylic dianhydride and 1,3-bis(4-aminophenoxy)benzene; or (5) 3,3',4,4'-biphenyltetracarboxylic dianhydride and 4,4'-bis(4-aminophenoxyphenyl)sulfone.

8. A process for preparing a metal film/aromatic polyimide film/metal film laminate which comprises the steps of:

coating on one surface of a first metal film a solution of a polyimide precursor which is produced from a combination of one or more of the following tetracarboxylic dianhydrides and one or more of the following diamine compounds: (1) 3,3',4,4'-biphenyltetracarboxylic dianhydride, 2,3,3',4'-biphenyltetracarboxylic dianhydride, 2,2-bis(3,4-dicarboxyphenyl)propane dianhydride and bis(3,4-dicarboxyphenyl)ether dianhydride and (2) 1,3-bis(4-aminophenoxy)benzene, 1,3-bis(3-aminophenoxy)benzene, 2,2-bis(4-aminophenoxyphenyl)propane, 4,4'-bis(4-aminophenoxyphenyl)sulfone and bis(4-aminophenoxy)biphenyl, to form a coated solution film on the metal film;

heating the coated solution film to produce an amorphous polyimide film on the metal film;

placing a second metal film and an aromatic polyimide substrate film having a thermoplastic surface on each surface thereof onto the amorphous polyimide film on the metal film, so as to form a film structure of the second metal film, the aromatic polyimide substrate film, the amorphous film, and the first metal film, in order; and pressing the film structure under heating to fix each film onto an adjoining film thereof.

9. The process of claim 8, wherein the pressing step is performed using a double belt press.

* * * * *